United States Patent
Rathbun, Jr.

(10) Patent No.: US 7,155,190 B2
(45) Date of Patent: Dec. 26, 2006

(54) DDS-PLL METHOD FOR FREQUENCY SWEEP

(75) Inventor: Lowell A. Rathbun, Jr., Vernonia, OR (US)

(73) Assignee: Tektronix, Inc., Beaverton, OR (US)

( * ) Notice: Subject to any disclaimer, the term of this patent is extended or adjusted under 35 U.S.C. 154(b) by 378 days.

(21) Appl. No.: 10/783,260

(22) Filed: Feb. 19, 2004

(65) Prior Publication Data

US 2005/0186929 A1    Aug. 25, 2005

(51) Int. Cl.
*H04B 1/06*    (2006.01)

(52) U.S. Cl. ............... 455/260; 455/183.1; 455/192.3; 331/4; 331/10; 375/376

(58) Field of Classification Search ............. 455/255, 455/260, 264, 265, 179.1, 180.3, 183.1, 188.1, 455/192.1, 192.3; 331/4, 10, 16, 19, 178; 375/376, 375

See application file for complete search history.

(56) References Cited

U.S. PATENT DOCUMENTS

| | | | |
|---|---|---|---|
| 4,728,906 A * | 3/1988 | Turl et al. .................. 331/4 |
| 5,179,725 A * | 1/1993 | Camp et al. ............... 455/264 |
| 5,838,749 A * | 11/1998 | Casper et al. ............. 375/376 |
| 6,118,345 A * | 9/2000 | Scheffold .................. 331/16 |

OTHER PUBLICATIONS

Rohde & Schwarz "Service Manual Instrument—Spectrum Analyzer R&S FSU3, R&S FSU8, R&S FSU26".

* cited by examiner

*Primary Examiner*—Quochien B. Vuong
(74) *Attorney, Agent, or Firm*—Francis I. Gray; Michael A. Nelson

(57) ABSTRACT

A high frequency sweep generator uses a DDS-PLL method for frequency sweep over wide frequency spans. A digital sweep generator produces a linear ramp signal using DDS techniques that is applied to a coarse tuning port of a high frequency tunable oscillator, such as a YIG tunable oscillator (YTO). A PLL has as inputs an accurate linear swept frequency sinusoid from a DDS and a linear swept frequency output signal from the YTO to produce an error correction signal that is applied to a fine tuning port of the high frequency tunable oscillator. The error correction signal compensates for any non-linearities introduced into the linear swept frequency output signal by the high frequency tunable oscillator.

6 Claims, 3 Drawing Sheets

DDS-PLL METHOD FOR FREQUENCY SWEEP

BACKGROUND OF THE INVENTION

The present invention relates to analog and digital radio frequency (RF) control techniques, and more particularly to a direct digital systhesizer (DDS)—phase locked loop (PLL) method for frequency sweep that generates and controls accurate and linear wideband frequency sweeps in an analog frequency control section of RF and microwave swept real-time spectrum analyzers.

Generating an accurate linear wideband frequency sweep in swept microwave spectrum analyzers has historically been hindered by a number of nuisance problems. The swept oscillator in these instruments is traditionally a yttrium-iron-garnet (YIG) tuned oscillator (YTO). These oscillators generally have a tuning port for coarse frequency tuning and an FM port for fine frequency tuning. For narrow frequency spans the voltage at the tuning port is held constant and a small ramp signal is applied to the FM tuning port. For wide frequency spans the voltage at the FM tuning port is held constant and a ramp signal is applied to the tuning port. When these oscillators are swept over wide frequency spans, they commonly suffer from non-linearity caused by hysteresis, post-tune drift, frequency offsets, slow response time, intrinsic non-linearity and other problems which substantially hinder the frequency accuracy and linearity of these frequency sweeps. Previously no error correction was used—good design practice was followed to minimize the sweep frequency error.

Another technique used in some spectrum analyzers is to use phase-locked loop (PLL) technology to drive the frequency sweep to provide some sweep error correction. For narrow frequency spans a multi-PLL synthesizer 28 provides one of a plurality of fixed tuning voltages to the YTO and a DSP provides the frequency tuning on the output from an ADC, as shown partially in FIG. 1.

What is desired is a method for frequency sweep in a swept microwave spectrum analyzer that is accurate and linear, correcting for frequency sweep errors over wide frequency spans in a YTO.

BRIEF SUMMARY OF THE INVENTION

Accordingly the present invention provides a direct digital synthesizer-phase-locked loop (DDS-PLL) method for frequency sweep where the PLL controls the output frequency of a YTO and in turn is swept in frequency by a DDS whose output is applied to a frequency reference port of the PLL. A digital sweep generator provides a linear ramp signal to a coarse tuning port of the YTO, with the amplitude of the linear ramp signal determining the swept frequency span. The DDS-PLL output provides an error correction signal to a fine tuning port of the YTO to compensate for any non-linearities in the output swept frequency signal from the YTO. All parameters of the digital sweep generator may be accurately determined due to the digital architecture. The result is an accurate and linear swept frequency signal at the output of the YTO.

The objects, advantages and other novel features of the present invention are apparent from the following detailed description when read in conjunction with the appended claim and attached drawing.

DETAILED DESCRIPTION OF THE INVENTION

Figure 1:
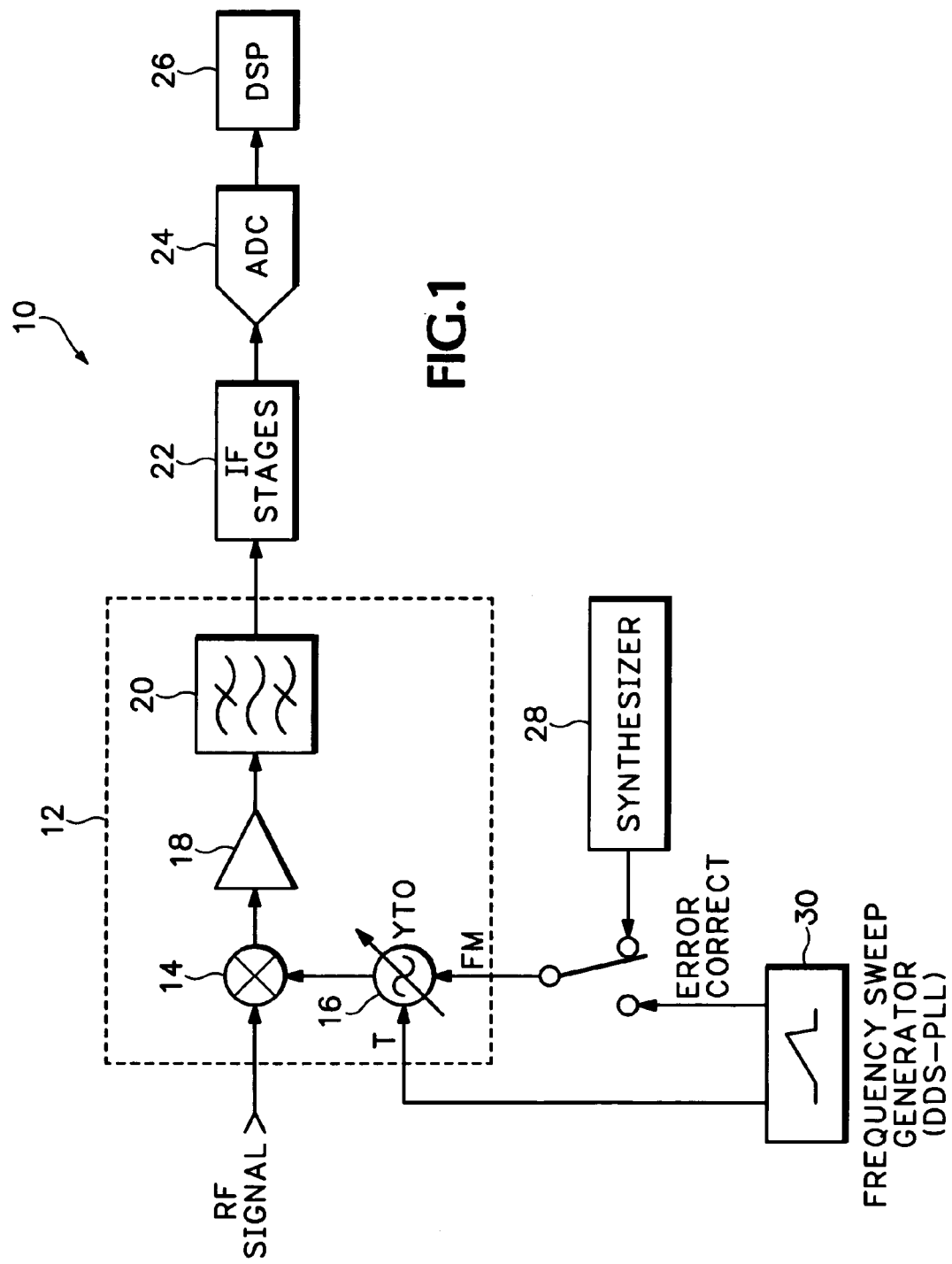
FIG. 1 is a block diagram view of a typical spectrum analyzer having a YIG tunable oscillator which includes a DDS-PLL frequency sweep generator according to the present invention.

The typical spectrum analyzer 10 shown in FIG. 1 includes an input mixing stage 12 that receives an input RF signal at a first mixer 14 to which also is input a frequency signal from a YTO 16. The frequency converted signal is input to an amplifier 18 and subsequently filtered by a bandpass filter 20 to produce a first IF signal. The first IF signal is processed by subsequent IF mixing stages 22 before being digitized by an ADC 24. The digitized signal is then processed by a DSP 26. According to prior techniques the YTO 16 is controlled by a synthesizer 28 or similar control signal generator. However for wide frequency spans an alternative sweep generator 30 is shown which uses the DDS-PLL technique together with digital synthesis of a ramp control signal as described below.

Figure 2:
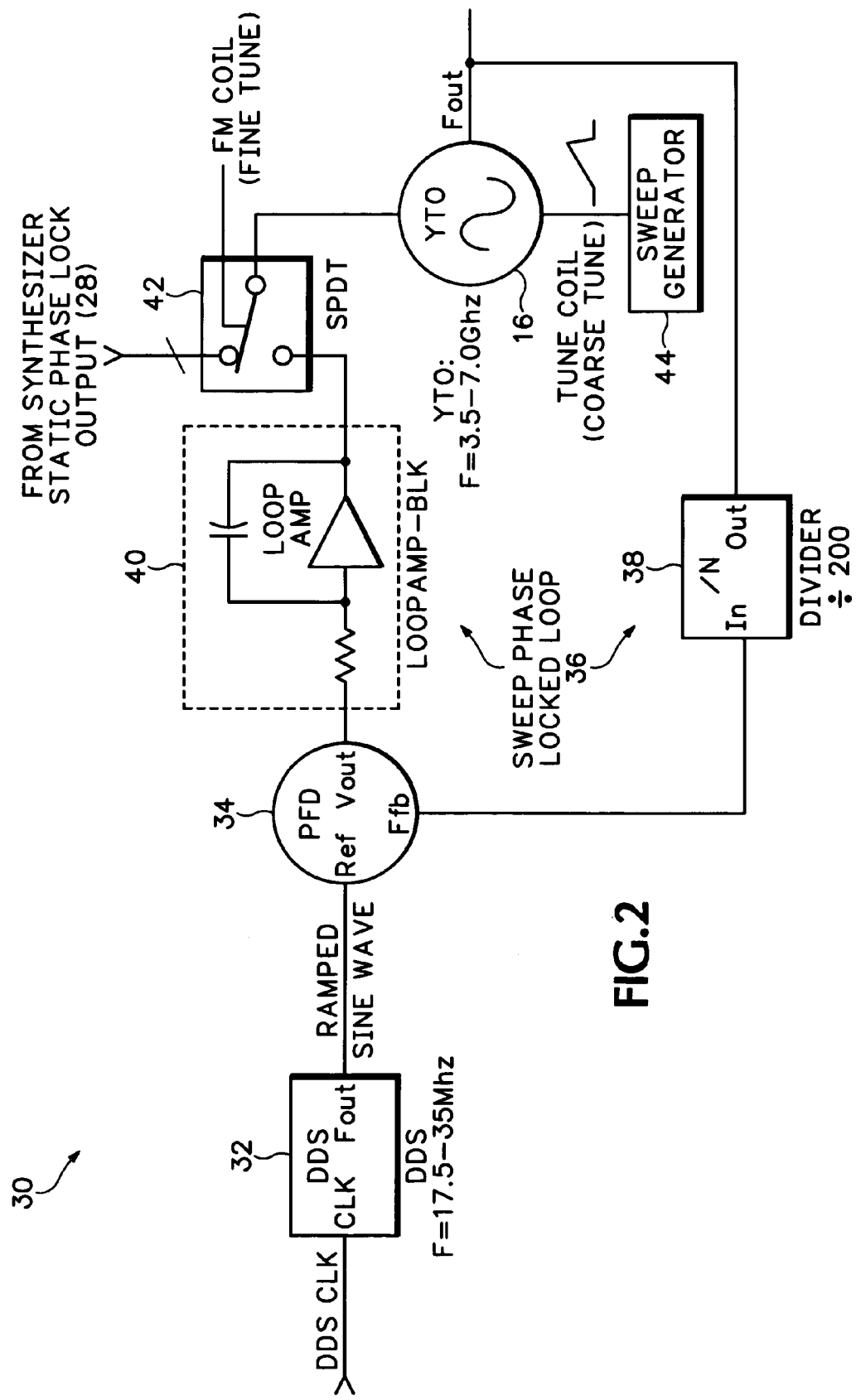
FIG. 2 is a block diagram view of a DDS-PLL error sweep correction circuit according to the present invention.

Referring now to FIG. 2 the DDS-PLL sweep generator 30 is shown having a direct digital synthesizer (DDS) 32 that is clocked by a DDS clock. The DDS 32 is operated in a frequency shift keying (FSK) mode where an increment is changed by a fixed amount each DDS clock cycle for accumulation to address a sinusoid lookup table. The output from the DDS 32 is a linear frequency ramped sinusoid, i.e., a sinusoid where the period of each cycle changes linearly across a frequency span, such as 17.5–35 MHz. The ramped sinusoid is input to a phase/frequency discriminator (PFD) 34 of a swept phase locked loop 36 where it is compared to the swept frequency output $F_{out}$ from the YIG tuned oscillator (YTO) 16 via an appropriate divider circuit 38. The output from the PFD 34 is input to the loop filter/amplifier 40, and the resulting voltage is applied via a switch 42 to the FM, or fine tuning, port of the YTO 16. A digital sweep generator 44, described below, provides the basic linear ramp control signal to the T, or coarse tuning, port of the YTO 16, while the DDS-PLL output from the swept phase locked loop 36 provides frequency error correction for the YTO to compensate for non-linearities introduced by the YTO itself in the output swept frequency signal.

Figure 3:
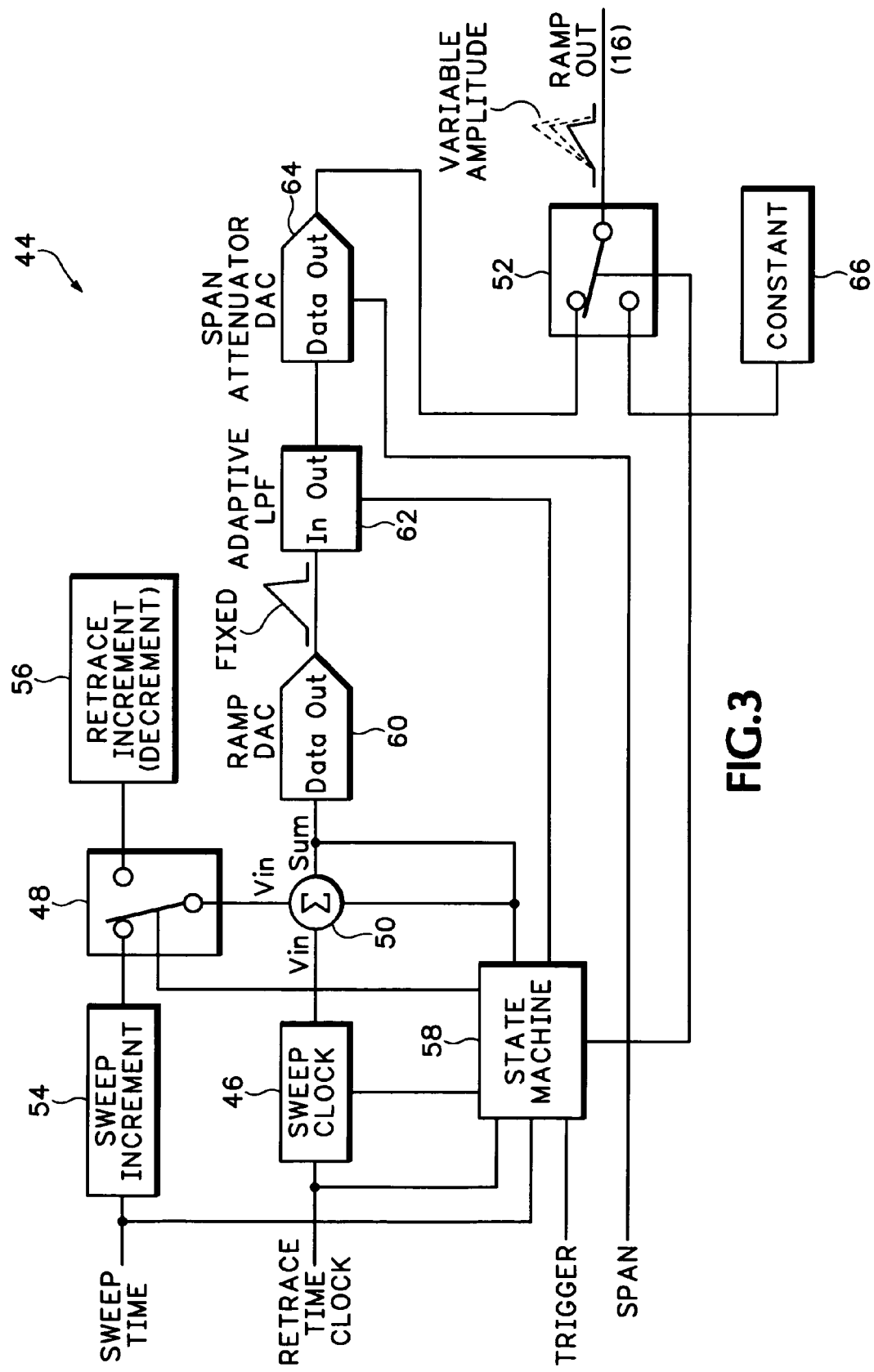
FIG. 3 is a block diagram view of a sweep generator for the DDS-PLL error sweep correction circuit of FIG. 2 according to the present invention.

One example of the digital sweep generator 44 is shown in FIG. 3. The digital architecture has a controlled sweep clock 46 having as an input a system clock. The sweep clock 46 is input to an accumulator 50 which also has as an input an increment/decrement from respective sweep and retrace registers 54, 56. A state machine 58 has as inputs the system clock, a trigger signal and the output of the accumulator 50. The state machine 58 in response to its inputs controls the sweep clock 46. The state machine 58 controls the sweep clock 46 as well as a switch 48 that selects either the sweep or the retrace register 54, 56 for input to the accumulator 50. A ramp digital-to-analog converter (DAC) 60 converts the output from the accumulator 50 to a fixed amplitude ramp signal at its output. The fixed amplitude ramp signal is filtered by an adaptive lowpass filter (LPF) 62 to eliminate quantization noise (step discontinuities) generated by the DAC 60 and thus suppresses the level of spurs which may appear in the YTO output. The filtered ramp then is input to a multiplying DAC 64 which acts as a span attenuator. The multiplying DAC 64 serves to avoid "graininess" in narrower sweep ranges. For example the LPF 62 may have 5 KHz bandwidth as the widest bandwidth, with lower bandwidths for slower sweeps as controlled by the state machine 58, thus reducing the amplitude of the DAC 60 steps. The output from the multiplying DAC 64 is a variable amplitude linear ramp signal, where the amplitude is a function of a span command applied to the multiplying DAC. The amplitude of the variable amplitude ramp signal determines the frequency span of the swept frequency signal output by the YTO 16. Due to this DDS architecture for generating the frequency ramp signal, complete control over ramp parameters is achieved, eliminating tweaks and greatly increasing ramp waveform accuracy. A sweep time value is loaded into the sweep register 54, while a retrace time value is loaded into the retrace register 56.

Upon receipt of a trigger signal the state machine 58 enables the sweep clock 46 to clock the accumulator 50 in response to the system clock. The state machine 58 selects via the switch 48 the sweep register 54 for input to the accumulator 50. When the accumulator 50 reaches its maximum value, the state machine 58 switches the input to the accumulator from the sweep register 54 to the retrace register 56 between DDS clock cycles to cause the accumulator to start decrementing. When the accumulator 50 reaches its minimum value, the state machine 58 disables the sweep clock 46. The state machine 58 in response to the sweep time value determines the appropriate bandwidth for the LPF 62. Since the accumulator 50 provides a ramp between the minimum value and the maximum value to provide the fixed amplitude ramp signal for input to the ramp DAC 60, the sweep time value determines the sweep period and the retrace time value determines the retrace period. Once the retrace is complete, the state machine 58 pauses and waits for another trigger to initiate the next linear ramp signal. If the trigger level is left active, the state machine 58 automatically initiates another sweep and retrace.

When a narrow frequency span for the YTO 16 is desired, an output switch 52 in the sweep generator 44 switches the output from the ramp output of the multiplying DAC 64 to a constant value from a constant voltage source 66 for application to the tuning port. Alternatively the output switch 52 and constant voltage source 66 may be eliminated if the minimum value from the multiplying DAC 64 is at the appropriate voltage level. Likewise the switch 42 in the DDS-PLL sweep generator 30 couples the synthesizer 28 to the fine tune port of the YTO 16. In this way the spectrum analyzer 10 is configured for conventional narrow frequency span operation.

Thus the present invention provides a DDS-PLL method for controlling the output frequency of a YTO by using a digital DDS technique to generate an accurate ramp signal for the YTO, and a DDS-PLL error correction circuit for compensating for any non-linearities in the swept frequency output of the YTO.

What is claimed is:

1. A high frequency sweep generator using a high frequency tunable oscillator having a coarse tune port and a fine tune port for producing a linear swept high frequency signal comprising:
   means for digitally generating a controllable linear ramp sweep signal for coupling to the coarse tune port; and
   means for generating from the swept high frequency signal an error correction signal for coupling to the fine tune port that compensates for non-linearities in the linear swept high frequency signal, the error correction generating means comprising:
   a direct digital frequency synthesizer for generating a linear, frequency ramped sinusoid; and
   a phase locked loop having as inputs the linear, frequency ramped sinusoid and the swept high frequency signal and producing as an output the error correction signal.

2. The high frequency sweep generator as recited in claim 1 wherein the controllable linear ramp sweep signal digital generating means comprises:
   a programmable accumulator clocked by a sweep clock and having a sweep time increment as input to produce a sweep ramp signal during a sweep time and a retrace time increment as input to produce a retrace signal during a retrace time, the sweep ramp signal and retrace signal producing the controllable linear ramp sweep signal; and
   means for controlling the sweep clock in response to a trigger signal to produce the controllable linear ramp sweep signal from the sweep ramp signal and the retrace signal.

3. A high frequency sweep generator comprising:
   a high frequency tunable oscillator having a coarse tune port and a fine tune port for producing a linear swept high frequency signal;
   a digital sweep generator for generating a controllable linear ramp sweep signal for coupling to the coarse tune port of the high frequency tunable oscillator;
   a divider for dividing the linear swept high frequency signal;
   a direct digital frequency synthesizer for receiving a direct digital synthesizer clock and generating a linear, frequency ramped sinusoid;
   a phase/frequency detector for producing an error correction signal in response to the linear, frequency ramped sinusoid and the divided linear swept high frequency signal; and
   a loop filter for filtering the error correction signal, the filtered error correction signal being coupled to the fine tune port of the high frequency tunable oscillator.

4. The high frequency sweep generator of claim 3 wherein the direct digital frequency synthesizer is operated in a frequency shift keying mode, where an increment is changed by a fixed amount each direct digital synthesizer clock cycle for accumulation to address a sinusoid lookup table.

5. A method of generating a linear swept high frequency signal using a high frequency tunable oscillator having a coarse tune port and a fine tune port comprising:
   digitally generating a controllable linear ramp sweep signal for coupling to the coarse tune port of the high frequency tunable oscillator;
   dividing the linear swept high frequency signal;
   generating a linear, frequency ramped sinusoid using a direct digital frequency synthesizer, the direct digital frequency synthesizer receiving a direct digital synthesizer clock;
   producing an error correction signal in response to the linear, frequency ramped sinusoid and the divided linear swept high frequency signal; and
   filtering the error correction signal, the filtered error correction signal being coupled to the fine tune port of the high frequency tunable oscillator.

6. The method of claim 5 wherein the generating step further comprises operating the direct digital frequency synthesizer in a frequency shift keying mode, where an increment is changed by a fixed amount each direct digital synthesizer clock cycle for accumulation to address a sinusoid lookup table.

* * * * *